(12) United States Patent
Hiroki

(10) Patent No.: US 9,520,309 B2
(45) Date of Patent: Dec. 13, 2016

(54) SUBSTRATE PROCESSING APPARATUS AND SUBSTRATE PROCESSING METHOD

(71) Applicant: TOKYO ELECTRON LIMITED, Minato-ku (JP)

(72) Inventor: Tsutomu Hiroki, Nirasaki (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 349 days.

(21) Appl. No.: 14/211,550

(22) Filed: Mar. 14, 2014

(65) Prior Publication Data
US 2014/0271051 A1  Sep. 18, 2014

(30) Foreign Application Priority Data
Mar. 15, 2013  (JP) .................................. 2013-053309

(51) Int. Cl.
*H01L 21/67* (2006.01)
*H01L 21/677* (2006.01)

(52) U.S. Cl.
CPC ... *H01L 21/67167* (2013.01); *H01L 21/67745* (2013.01)

(58) Field of Classification Search
CPC ................................................ H01L 21/67745
See application file for complete search history.

(56) References Cited

U.S. PATENT DOCUMENTS

| | | | | |
|---|---|---|---|---|
| 4,182,994 A * | 1/1980 | Aschwanden | ........ | H03J 5/0272 331/1 A |
| 4,770,121 A * | 9/1988 | Ebata | ...................... | C23C 16/54 118/500 |
| 4,954,301 A * | 9/1990 | Saeki | ................ | H01L 21/67126 264/328.4 |
| 5,329,732 A * | 7/1994 | Karlsrud | ................. | B24B 37/08 451/289 |
| 6,293,855 B1 * | 9/2001 | Yoshida | .................. | B24B 37/04 451/287 |
| 7,210,246 B2 * | 5/2007 | van der Me | ............. | B25J 9/042 34/403 |
| 7,286,890 B2 * | 10/2007 | Machiyama | ...... | H01L 21/67276 700/114 |
| 8,274,248 B2 * | 9/2012 | Hirata | ...................... | H02P 6/06 318/268 |
| 2011/0188974 A1 * | 8/2011 | Diamond | .......... | H01L 21/67742 414/217 |

FOREIGN PATENT DOCUMENTS

JP    2010-074073    4/2010

* cited by examiner

*Primary Examiner* — James Keenan
(74) *Attorney, Agent, or Firm* — Oblon, McClelland, Maier & Neustadt, L.L.P.

(57) ABSTRACT

A substrate processing apparatus for processing a substrate includes a transfer device which has a drive motor and transfers a substrate, a peripheral device which has a drive motor and loads and unloads the substrate in substrate-transfer operation of the transfer device, and a control device which conducts drive control on the drive motor of the transfer device and drive control of the drive motor of the peripheral device.

18 Claims, 4 Drawing Sheets example of present invention comparative example

Prior Art

SUBSTRATE PROCESSING APPARATUS AND SUBSTRATE PROCESSING METHOD

CROSS-REFERENCE TO RELATED APPLICATIONS

The present application is based upon and claims the benefit of priority to Japanese Patent Application No. 2013-053309, filed Mar. 15, 2013, the entire contents of which are incorporated herein by reference.

BACKGROUND OF THE INVENTION

Field of the Invention

The present invention relates to a substrate processing apparatus for processing a substrate such as a semiconductor wafer and to a method for processing the same.

Description of Background Art

A substrate processing apparatus for processing a semiconductor wafer (hereinafter referred to as a "wafer") such as plasma etching may include the following: between a load port provided with a front opening unified pod (FOUP), which is a container to accommodate multiple wafers, and a process module (vacuum processing chamber) for performing plasma treatment on wafers; a loader module which is kept under atmospheric ambience and is for loading/unloading semiconductor wafers to/from a FOUP; a transfer module which is kept under vacuum ambience and is for loading/unloading wafers to/from the process module; and a load-lock module which is positioned between the loader module and the transfer module and is kept switchable between atmospheric ambience and vacuum ambience.

In such a substrate processing apparatus, a first transfer device is provided in the transfer module and a second transfer device is provided in the loader module, and those devices transfer wafers between the load port and the process module. Here, the first transfer device is driven mainly by a motor, for example, and opening/closing the gate valve for communication/isolation between the process module and the transfer module is controlled by an air cylinder (see JP 2010-074073A). The entire contents of this publication are incorporated herein by reference.

FIG. 4 is a view schematically showing the structure of a wafer transfer control system of the aforementioned substrate processing apparatus. To simplify the description, first transfer device 94 is set to be driven by motors (94a, 94b). The total control on the substrate processing apparatus is performed by master controller 90. As a lower controller of master controller 90, robot controller 91 is provided to control motors (94a, 94b) of first transfer device 94. Opening/closing gate valve 95 for communication/isolation between the process module and the transfer module by gate-valve driver 92 is controlled by master controller 90. In addition, master controller 90 also controls elevator-pin motor 93 to lift/lower elevator pin 96 which is provided in the process module and handles the delivery of a wafer to/from the first transfer device 94.

SUMMARY OF THE INVENTION

According to one aspect of the present invention, a substrate processing apparatus for processing a substrate includes a transfer device which has a drive motor and transfers a substrate, a peripheral device which has a drive motor and loads and unloads the substrate in substrate-transfer operation of the transfer device, and a control device which conducts drive control of the drive motor of the transfer device and drive control of the drive motor of the peripheral device.

According to another aspect of the present invention, a substrate processing apparatus includes a chamber which accommodates a substrate and has a substrate loading-unloading port, an open-close device which has a drive motor and opens and closes the substrate loading-unloading port, an elevator device which has a drive motor and lifts and lowers the substrate in the chamber, a transfer device which has a drive motor and loads and unloads the substrate to and from the chamber, and a control device which conducts drive control of the drive motor of the transfer device, drive control of the drive motor of the open-close device and drive control of the drive motor of the elevator device.

According to yet another aspect of the present invention, a method for processing a substrate includes transmitting a signal from a control device of a substrate processing apparatus to a drive motor of a transfer device in the substrate processing apparatus such that the transfer device transfers a substrate inside the substrate processing apparatus, and transmitting a signal from the control device to a drive motor of a peripheral device in the substrate processing apparatus such that the peripheral device loads or unloads the substrate to or from the transfer device in substrate-transfer operation of the transfer device.

According to still another aspect of the present invention, a method for processing a substrate includes transmitting a signal from a control device of a substrate processing apparatus to a drive motor of an open-close device in the substrate processing apparatus such that the open-close device opens or closes a substrate loading-unloading port of a chamber which accommodates a substrate in the substrate processing apparatus, transmitting a signal from the control device to a drive motor of an elevator device in the substrate processing apparatus such that the elevator device lifts or lowers the substrate in the chamber, and transmitting a signal from the control device to a drive motor of a transfer device in the substrate processing apparatus such that the transfer device transfers the substrate in the substrate processing apparatus.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein:

FIG. 3(*b*) is a timeline showing the wafer unloading process by a wafer transfer control system (comparative example)

DETAILED DESCRIPTION OF THE EMBODIMENTS

Figure 1:
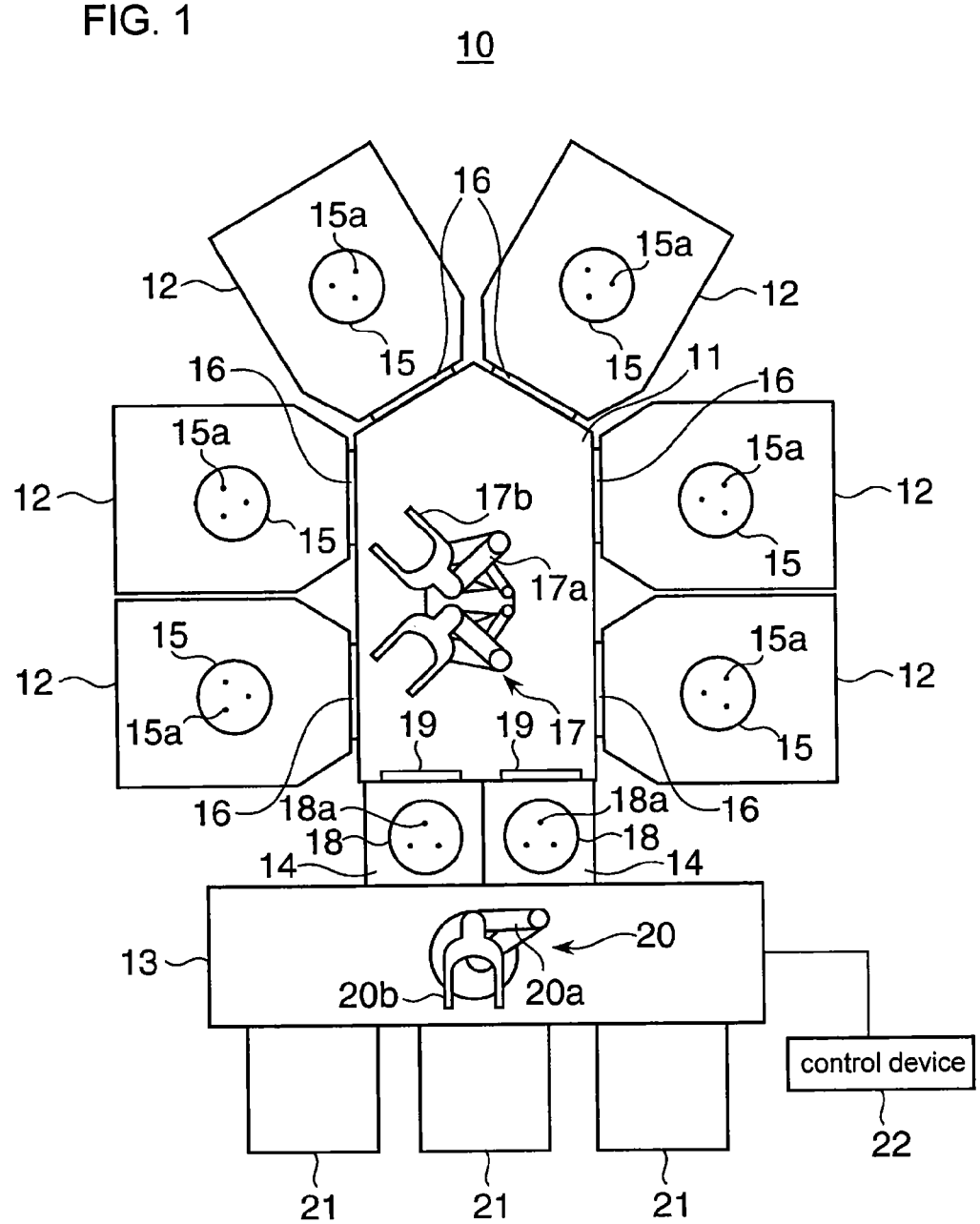
FIG. 1 is a plan view schematically showing the structure of a substrate processing apparatus according to an embodiment of the present invention.

The embodiments will now be described with reference to the accompanying drawings, wherein like reference numerals designate corresponding or identical elements throughout the various drawings.

Here, the embodiment employs an example of a semiconductor wafer ("wafer") with a diameter of 450 mm (φ450 mm), and a substrate processing apparatus for performing plasma treatment as a processing example on the wafer conducted under vacuum ambience.

FIG. 1 is a plan view schematically showing substrate processing apparatus 10 according to an embodiment of the present invention. Substrate processing apparatus 10 is structured to perform plasma treatment on each wafer (W) (one at a time). More specifically, substrate transfer apparatus 10 includes transfer module 11 (substrate transfer chamber) shaped as a pentagon on a plan view, six process modules 12 (substrate treatment chambers) connected to transfer module 11 and radially arranged to surround transfer module 11, loader module 13 positioned opposite transfer module 11, and two load-lock modules 14 (atmospheric/vacuum switching chambers) positioned between transfer module 11 and loader module 13.

A process module 12 has a vacuum chamber, and a columnar stage 15 is provided as a mounting stage for a wafer (W) in the vacuum chamber. In process module 12, after wafer (W) is mounted on stage 15, the vacuum chamber is set at a predetermined vacuum degree and a processing gas is introduced while high-frequency electric power is applied in the vacuum chamber to generate plasma. Then, plasma treatment such as etching is performed on the wafer (W) by the generated plasma.

Process module 12 and transfer module 11 are separated by gate valve 16, which is structured to open/close freely. Opening/closing of the wafer loading/unloading port door of process module 12 by valve 16 is driven by first motor 31 (see FIG. 2).

On stage 15 in process module 12, multiple (three, in this example) thin rod-shaped elevator pins (15a) are provided to be capable of protruding freely from the top surface of stage 15. Elevator pins (15a) are arranged on the same circumference on a planar view. Elevator pins (15a) protrude from the top surface of stage 15 to lift and support a wafer (W) mounted on stage 15, and retract into stage 15 to place the wafer (W) on stage 15. The lifting/lowering of elevator pins (15a) is driven by second motor 32 (see FIG. 2).

Transfer module 11 is maintained under vacuum (reduced pressure) ambience, and is provided with first transfer device 17 having two SCARA-type transfer arms (17a). Two transfer arms (17a) are each structured to be capable of rotating and extending/retracting, and fork (end effector) (17b) as a mounting portion to mount a wafer (W) is installed at the tip of each arm. First transfer device 17 is capable of moving along a guide rail (not shown) provided in transfer module 11 and transferring a wafer (W) between a process module 12 and a load-lock module 14.

The main function of first transfer device 17 is moving and rotating the entire first transfer device 17 and extending/retracting transfer arm (17a). In the following description, moving the entire first transfer device 17 is driven by third motor 33 (see FIG. 2), rotating the entire first transfer device 17 is driven by fourth motor 34 (see FIG. 2), and extending/retracting transfer arm (17a) is driven by fifth motor 35 (see FIG. 2).

A load-lock module 14 is structured to be a chamber capable of adjusting inner pressure by switching its ambience between vacuum and atmospheric. On the transfer module 11 side of load-lock module 14, gate valve 19 is provided to open/close the wafer loading/unloading port door of load-lock module 14. Opening/closing the wafer loading/unloading port door of load-lock module 14 by gate valve 19 is driven by sixth motor 36 (see FIG. 2).

On the loader module 13-side of load-lock module 14, a gate valve (not shown) is provided to open/close a wafer loading/unloading port door of load-lock module 14. Opening/closing the wafer loading/unloading port door of load-lock module 14 by the gate valve (not shown) is also driven by a motor.

Columnar stage 18 as a place to mount a wafer (W) is formed in load-lock module 14. In stage 18, elevator pins (18a) the same as elevator pins (15a) are provided to be capable of protruding freely from the top surface of stage 18. The lifting/lowering of elevator pins (18a) is driven by seventh motor 37 (see FIG. 2).

When transferring a wafer (W) from loader module 13 to transfer module 11, first, load-lock module 14 maintains its atmospheric pressure and receives the wafer (W) from loader module 13, then reduces its inner pressure to vacuum and delivers the wafer (W) to transfer module 11. Inversely, when transferring a wafer (W) from transfer module 11 to loader module 13, first, load-lock module 14 maintains vacuum pressure and receives the wafer (W) from transfer module 11, then increases the inner pressure to atmospheric and delivers the wafer (W) to loader module 13.

Loader module 13 is structured as a rectangular atmospheric transfer chamber: load-lock module 14 is connected to a longitudinal side surface; and multiple (three in this example) FOUP mounting stages 21 for placing FOUPs as containers (not shown) to accommodate multiple wafers (W) are connected to the other longitudinal side surface.

In loader module 13, second transfer device 20 is positioned to transfer a wafer (W), and second transfer device 20 has a SCARA-type transfer arm (20a). Transfer arm (20a) is movable along a guide rail (not shown), and also is structured to be capable of rotating and extending/retracting. At the tip of transfer arm (20a), fork (20b) is installed for mounting a wafer (W), the same as in first transfer device 17. In loader module 13, second transfer device 20 transfers a wafer (W) between a FOUP set on a FOUP mounting stage 21 and a load-lock module 14.

Figure 2:
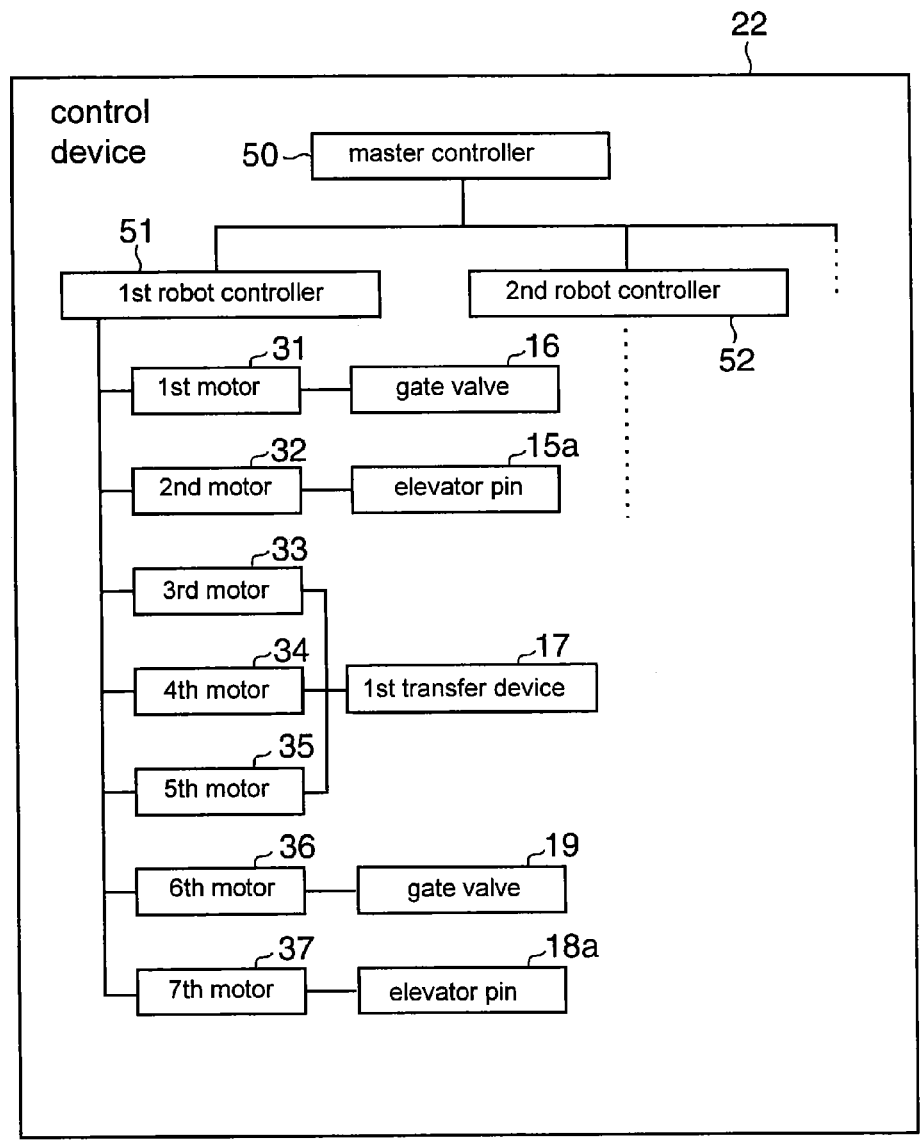
FIG. 2 is a block diagram schematically showing the structure of a wafer transfer control system in a control device of the substrate processing apparatus in FIG. 1.

The operational control on substrate processing apparatus 10 is carried out by control device 22. FIG. 2 is a block diagram schematically showing the structure of a wafer control system in control device 22. Control device 22 is provided with master controller 50, which is the primary control circuit. Master controller 50 reads out a recipe and program stored in a ROM (not shown) to a RAM (not shown) and executes the program according to the recipe so as to conduct overall operational control of substrate processing apparatus 10.

First robot controller 51 and second robot controller 52, which are lower-level control circuits, are connected to master controller 50. First robot controller 51 conducts control on a wafer (W) transferred by first transfer device 17 positioned in transfer module 11. Second robot controller 52 conducts control on a wafer (W) transferred by second transfer device 20 positioned in loader module 13.

Control on a wafer (W) transferred by second transfer device 20 is carried out the same way as control on a wafer (W) transferred by first transfer device 17. Thus, the following description is provided focusing on the manner of transfer control on a wafer (W) in a vacuum transfer system, namely, the manner of transfer control on a wafer (W) transferred by first transfer device 17 between load-lock module 14 and process module 12. Accordingly, illustrations regarding control on a wafer (W) transferred by second transfer device 20 are omitted in FIG. 2.

In the vacuum transfer system, transferring a wafer (W) by first transfer device 17, opening/closing gate valves (16, 19) needed to transfer a wafer (W) by first transfer device 17, and lifting/lowering elevator pins (15a, 18a) are all controlled by one first robot controller 51. "One controller" means that drive control signals are output from one controller, but its structure is not limited to one unit, for example, a CPU, and one or more units may execute integrated operations to generate drive control signals.

In particular, first robot controller 51 conducts drive control on first motor 31 to open/close gate valve 16 provided at process module 12, as well as drive control on second motor 32 to lift/lower elevator pins (15a) provided in process module 12. In addition, first robot controller 51 also conducts drive control on first transfer device 17, namely, drive control on third motor 33 to move the device, drive control on fourth motor 34 to rotate the device, and drive control on fifth motor 35 to extend/retract transfer arm (17a). Moreover, first robot controller 51 conducts drive control on sixth motor 36 to open/close gate valve 19 provided at load-lock module 14, as well as drive control on seventh motor 37 to lift/lower elevator pins (18a) provided in load-lock module 14.

As for first motor 31 through seventh motor 37, servo motors are used. First motor 31 through seventh motor 37 are operated under closed-loop control by first robot controller 51. Thus, when first motor 31 through seventh motor 37 each receive pulse signals from first robot controller 51 as a drive signal, the motors each rotate only by the rotation angle based on the values detected by a built-in encoder according to the amount of pulse signals. As a result, a distance of movement and angle of rotation of first transfer device 17, a degree of extending/retracting transfer arm (17a), a degree of opening/closing gate valves (16, 19), and a degree of lifting/lowering elevator pins (15a, 18a) are all controlled as drive targets. In other words, pulse signals (drive signals) are output from first robot controller 51 at an amount according to a desired distance of movement and a desired angle of rotation of first transfer device 17, a desired degree of extending/retracting transfer arm (17a), a desired degree of opening/closing gate valves (16, 19), and a desired degree of lifting/lowering elevator pins (15a, 18a).

As described in the embodiment above, compared with a conventional system in which a robot controller conducts only drive control on a transfer device, if a robot controller conducts drive control not only on a transfer device, but also on other peripheral components needed when a wafer is transferred, computational load on the robot controller increases. However, since the workload (computational load) on a master controller decreases, a master controller with processing capability lower than that of a conventional one may be used in the present embodiment. When cost reduction effects are compared between a master controller and a robot controller, the cost reduction effect on a master controller is significant, thus achieving greater cost reduction in the present embodiment than in a conventional system.

Moreover, by setting robot controller 51 to also conduct auxiliary control needed for a transfer process in addition to the drive control of the transfer device, communication time for transferring a wafer (W) is reduced. Throughput is thereby enhanced. The details in this regard are described in the following by using an example of the drive control to unload a wafer (W) from process module 12.

Figure 3A:
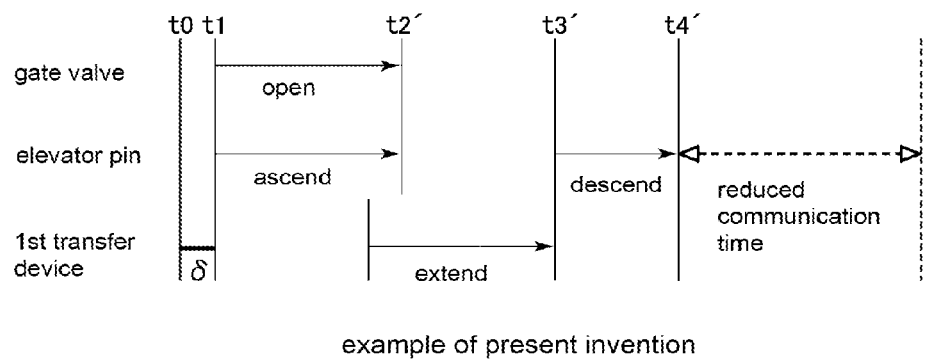
FIG. 3(*a*) is a timeline showing a wafer unloading process by the control device in FIG. 2 (example of the present invention)

FIG. 3(a) shows a timeline of a process for unloading a wafer (W) from process module 12 by control device 22 (an example of the present invention). For comparison purposes, a timeline (comparative example) is shown in FIG. 3(b) when a wafer is unloaded from a process module using the structure of a conventional substrate processing apparatus and wafer transfer control system shown in FIG. 4.

Figure 3B:
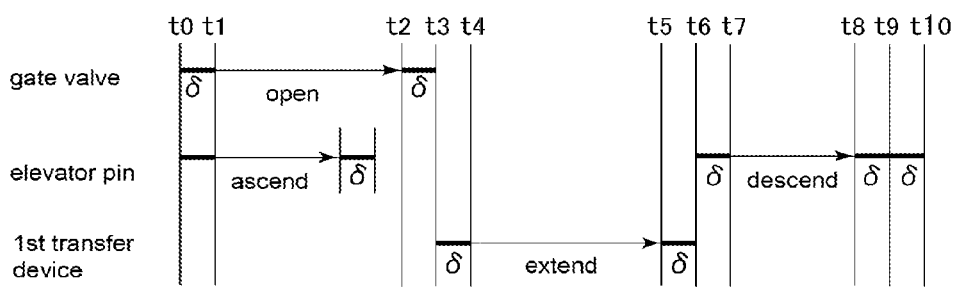

First, FIG. 3(b) is described. At time (t0), master controller 90 sends a drive signal to gate-valve driver 92 to open gate valve 95 while sending a drive signal to elevator-pin motor 93 for lifting elevator pin 96 to lift a wafer. Accordingly, communication time (δ) elapses and it becomes time (t1). In the following, to simplify the description, all communication times are each set as (δ). Also, although it is sufficient if first transfer device 94 is ready to extend the transfer arm to receive a wafer by later-described time (t3), first transfer device 94 is set to be ready to extend the transfer arm at (t0) in this example.

Gate valve 95 is driven by an air cylinder in a conventional substrate processing apparatus. Thus, at time (t1), gate valve 95 starts opening, and a sensor at a predetermined position sends a signal to master controller 90 when gate valve 95 opens completely. At time (t2), master controller 90 receives the signal that gate valve 95 has completely opened; accordingly, communication time (δ) elapses and it becomes time (t3). Here, according to a default setting, elevator pin 96 finishes ascending before gate valve 95 is completely open in a conventional substrate processing apparatus. Therefore, although communication time (δ) elapses when a signal is sent to master controller 90 that elevator pin 96 is completely lifted, the communication is completed before time (t2), and the elevator pin is already in a standby mode at time (t2).

At time (t3), when master controller 90 sends a drive signal to robot controller 91 to extend the transfer arm, communication time (δ) elapses and it becomes time (t4). At time (t4), extension of the transfer arm starts (a fork provided at the tip of the transfer arm enters a process module), and robot controller 91 sends a signal at time (t5) to master controller 90 that the extension is completed. Accordingly, communication time (δ) elapses and it becomes time (t6). At time (t6), master controller 90 sends a drive signal to elevator-pin motor 93 to lower elevator pin 96. Communication time (δ) thereby elapses and it becomes time (t7).

At time (t7), elevator pin 96 starts descending and completes its descent at time (t8). At time (t8), a signal is sent to master controller 90 that the descent of elevator pin 96 is finished. Communication time (δ) thereby elapses and it becomes time (t9). At time (t9), master controller 90 sends a drive signal to robot controller 91 for retracting the transfer arm of first transfer device 94. Communication time (δ) thereby elapses and it becomes time (t10). Accordingly, at time (t10), the transfer arm supporting a wafer at the tip (fork) can be retracted.

Next, the timeline in FIG. 3(a) is described. The definition of time (t1) in FIG. 3(a) is the same as that in FIG. 3(b). At time (t0), master controller 50 sends a drive signal to first robot controller 51 to unload a wafer (W) in a predetermined process module 12. Communication time (δ) thereby elapses and it becomes time (t1). Since gate valve 16 is driven by first robot controller 51, gate valve 16 starts opening at time (t1), and gate valve 16 becomes completely open at time (t2'). It is noted that gate valve 16 is driven by first motor 31, whereas gate valve 95 described in FIG. 3(b) is driven by an air cylinder, but the time during which gate valve 16 and gate valve 95 start opening and complete opening is set to be the same.

Since lifting/lowering elevator pin (15a) is also driven by first robot controller 51, elevator pin (15a) starts ascending at time (t1). Elevator pin (15a) ascends in the same manner as elevator pin 96 in FIG. 3(b), but elevator pin (15a) is set to ascend at a slower speed than that in FIG. 3(b) so as to complete its ascent at time (t2'). Such a control is simply performed by controlling the supply mode of pulse signals (changing the frequency of pulse signals, for example) sent to second motor 32 which drives elevator pin (15a).

If elevator pin (15a) is rapidly lifted, problems may arise; for example, the position of a wafer (W) may be shifted with regard to elevator pin (15a), or in an extreme scenario, the wafer (W) may fall while it is being lifted. Such problems are prevented by slowing the speed of elevator pins. Accordingly, a safe and secure process to lift a wafer (W) by elevator pin (15a) is enhanced.

The timing to start extending transfer arm (17a) is set to be the earliest time at which the arm can go under wafer (W) while avoiding interference (collide, contact) with gate valve 16. Thus, although transfer arm (17a) can start extending at time (t2'), it actually starts extending by a predetermined amount of time prior to time (t2') in this example.

What allows drive control of transfer arm (17a) to be controlled as above is that gate valve 16 and elevator pin (15a) are respectively driven by first motor 31 and second motor 32, which are servo motors as described above and are operated under closed-loop control. Namely, to what degree gate valve 16 is open and to what degree elevator pin (15a) ascends are known by the amount of pulse signals sent to first motor 31 and second motor 32. Thus, using the amount of pulse signals outputted to first motor 31 and second motor 32 as a trigger, a drive signal can be sent to fifth motor 35 for extending transfer arm (17a). Accordingly, by programming as sequence what amount of pulse signals is to be finished outputting to first motor 31 and second motor 32 before starting to send a drive signal to fifth motor 35 for extending transfer arm (17a), transfer arm (17a) can start extending by a predetermined amount of time prior to time (t2').

The time at which gate valve 16 has opened completely and elevator pin (15a) has ascended completely are also known from the amount of pulse signals outputted to first motor 31 and second motor 32. Therefore, even if transfer arm (17a) is set to start extending after gate valve 16 has completely opened and elevator pin (15a) has completely ascended, it is not necessary to communicate with master controller 90 that gate valve 95 is completely open as described with reference to FIG. 3(b). That being the case, there is no need to send from master controller 90 to robot controller 91 a drive signal for extending the transfer arm of first transfer device 94. Accordingly, transfer arm (17a) can start extending at time (t2'), thus reducing communication time from (t2) through (t4) in FIG. 3(b).

The duration needed for extending transfer arm (17a) is set to be the same as that for the transfer arm of first transfer device 94 shown in FIG. 3(b). The time at which transfer arm (17a) has extended completely is also known from the amount of pulse signals outputted to fifth motor 35. Accordingly, elevator pin (15a) can start lowering at time (t3') when transfer arm (17a) is completely extended, thus reducing communication time (t5) through (t7) in FIG. 3(b).

The duration needed for lowering elevator pin (15a) is the same as that for lowering elevator pin 96 shown in FIG. 3(b). The time at which elevator pin (15a) has finished descending is also known from the amount of pulse signals outputted to second motor 32. Accordingly, communication time (t8) through (t10) in FIG. 3(b) is reduced. Thus, at the same time as time (t10), time (t4') when elevator pin (15a) has completed its descent is set to be the time for retracting transfer arm (17a) that has a wafer (W) on fork (17b).

Figure 4:
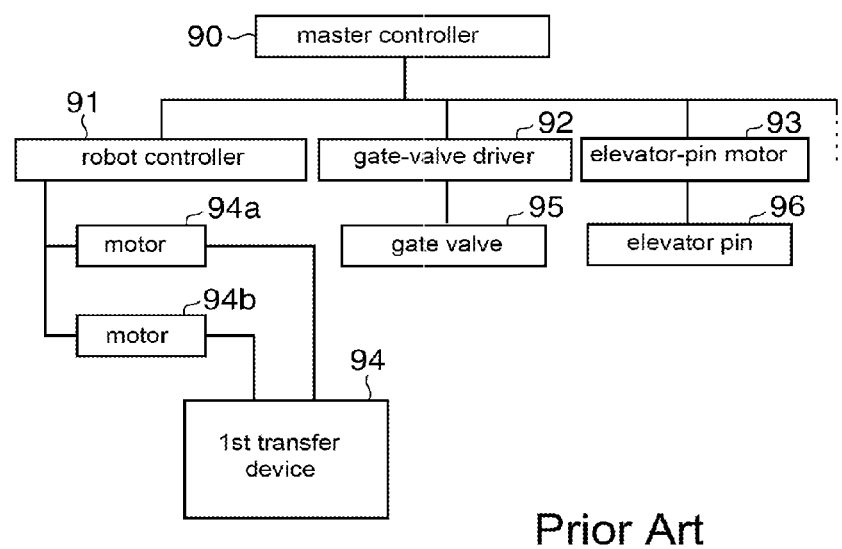
FIG. 4 is a view schematically showing the structure of a wafer transfer control system of a conventional substrate processing apparatus.

As found to be clear in comparing timelines in FIGS. 3(a) and 3(b), the wafer transfer control system shown in FIG. 2 is capable of significantly reducing the time needed to unload a wafer (W), compared with a conventional wafer transfer control system (FIG. 4). It is clear that such time reduction effects are also achieved when a wafer (W) is unloaded from load-lock module 14 and when a wafer (W) is loaded into process module 12 and load-lock module 14.

As described so far, conventionally, master controller 90 sequentially outputs a control signal individually to robot controller 91, gate-valve driver 92, elevator-pin motor 93 and the like, respectively. Thus, the number of communications increases, and one operation is set to start only when a prior operation has been completed, thereby rendering different operations unable to be conducted simultaneously. Accordingly, throughput is not improved.

By contrast, according to an embodiment of the present invention, one robot controller, namely, first robot controller 51, controls all the motors (first motor 31 through seventh motor 37) related to transferring a wafer (W) by pulse signals under closed-loop operations. Therefore, the number of communications decreases and the time required for communications is reduced. Moreover, since positions of first transfer device 17, gate valves (16, 19) and elevator pins (15a, 18a) while they are operating are respectively known by the amount of pulse signals outputted to corresponding motors, a subsequent operation is set to start without waiting for the current operation to be completed. Accordingly, different operations are executed simultaneously, and throughput is significantly improved. In addition, since detecting the positions of gate valves (16, 19) and elevator pins (15a, 18a) using a sensor or the like is not required, operational costs of substrate processing apparatus 10 are reduced.

Moreover, since the operational speed of first transfer device 17 and elevator pin (15a) is not increased from those in the conventional art, safe and secure transfer of a wafer (W) is maintained. Also, decreasing the speed of ascent of elevator pin (15a) in response to the speed of gate valve 16 is easily conducted by drive control through pulse signals. Therefore, enhancing the safe and secure transfer of a wafer (W) by elevator pin (15a) is achieved.

It is noted that lifting/lowering elevator pin (18a) provided in load-lock module 14 is controlled by first robot controller 51 or by second robot controller 52 depending on the operation. However, substrate processing apparatus 10 is under the total control of master controller 50 so that the gate valve on the loader module 13 side and gate valve 19 on the transfer module 11 side will not open simultaneously in load-lock module 14, while elevator pin (18a) ascends/descends in association with opening/closing of the gate valve on the loader module 13 side or opening/closing of gate valve 19 on the transfer module 11 side. Accordingly, lifting/lowering control by first robot controller 51 does not become mixed with lifting/lowering control by second robot controller 52, and control confusion will not occur.

Here, lifting/lowering of elevator pin (18a) provided in load-lock module 14 may be controlled directly by master controller 50. In such a case as well, since opening/closing of gate valve 16 and lifting/lowering of elevator pin (15a) in process module 12 are controlled by first robot controller 51, when a wafer (W) is transferred between load-lock module 14 and process module 12, communication time is shorter than that in a conventional structure (FIG. 4), thereby improving throughput.

So far, an embodiment of the present invention has been described. However, the present invention is not limited to the above. For example, a plasma processing apparatus was named as the substrate processing apparatus of the above embodiment. However, that is not the only option. Embodiments of the present invention may also be employed in a deposition processing apparatus to conduct deposition on substrates, in a cleaning apparatus to clean substrates, in a processing apparatus to conduct a predetermined treatment that requires transfer of substrates, or the like.

Moreover, a semiconductor wafer was used as substrates in the above embodiment. However, other substrates such as glass substrates for flat panel displays (FPD), ceramic substrates or the like may also be used.

In the wafer transfer system shown in FIG. 4, for example, when a wafer held by first transfer device 94 is loaded into a process module, master controller 90 sends a transfer control signal to robot controller 91. According to the received transfer control signal, robot controller 91 drives first transfer device 94 (motor 94a) so that first transfer device 94 is controlled to be ready for loading a wafer to a process module by extending the transfer arm or the like when gate valve 95 is open. Also, master controller 90 sends a control signal to gate-valve driver 92 to open gate valve 95.

Next, according to a signal received from gate-valve driver 92 that the gate valve has opened, master controller 90 sends to robot controller 91 a transfer control signal for loading a wafer to a process module by extending the transfer arm of first transfer device 94. Based on the received transfer control signal, robot controller 91 drives first transfer device 94 (motor 94b) to load the wafer into a process module by extending the transfer arm or the like. Then, when a signal is received from robot controller 91 that the wafer is loaded into the process module, master controller 90 sends a control signal to elevator-pin motor 93 to lift elevator pin 96. When elevator pin 96 is lifted, the wafer (W) is delivered from first transfer device 94 to elevator pin 96.

As described above, in the wafer transfer system in FIG. 4, master controller 90 sends control signals sequentially to robot controller 91 (transfer robot), gate-valve driver 92, elevator-pin motor 93 and the like. Accordingly, from the time gate valve 95 opens to the time first transfer device 94 extends its transfer arm, the total required communication time is the sum of the communication time of a control signal from gate-valve driver 92 to master controller 90 and the communication time of a control signal from master controller 90 to robot controller 91. Therefore, in the substrate processing apparatus in FIG. 4, a longer communication time is required for control by a wafer transfer control system, and improvement of throughput is thereby hindered.

By contrast, to improve throughput and enhance productivity, increasing operational speed of a transfer robot is thought to be an option. However, in practice, due to technological limitations involved in securely holding a wafer at an increased speed, it is difficult to speed up the operation of a transfer robot. Even if new technology for holding a wafer is developed, problems may still arise such as a wafer being blown away when a transfer robot makes a sudden stop caused by abnormalities. Namely, there is still a significantly high barrier before reliable technology is established for holding a wafer in consideration of potential abnormalities.

Using a substrate processing apparatus and substrate processing method according to an embodiment of the present invention, throughput is improved without increasing the operational speed of a transfer robot.

A substrate processing apparatus according to an embodiment of the present invention conducts predetermined treatment on a substrate, and is characterized by having a controller that controls one or multiple motors that drive a transfer device for transferring a substrate as well as one or multiple other motors that drive other drive components needed for the operation by the transfer device when a wafer is loaded to a predetermined position or unloaded from a predetermined position.

A substrate processing apparatus according to another embodiment of the present invention is characterized by having the following: a chamber to accommodate a substrate; an opening/closing member to open/close a substrate loading/unloading port door of the chamber; an elevator member to lift/lower the substrate in the chamber; a transfer device to load/unload the substrate to/from the chamber; multiple motors to respectively drive the opening/closing member, the elevator member, and the transfer device; and another controller to conduct drive control of the multiple motors.

A substrate processing apparatus according to yet another embodiment of the present invention is characterized as follows: the multiple motors in the above substrate processing apparatus are servo motors driven by pulse signals, and the one controller controls the multiple motors under closed-loop control through pulse signals.

A substrate processing apparatus according to yet another embodiment of the present invention is characterized as follows: using the amount of pulse signals as a trigger when one motor among multiple motors has conducted a predetermined rotation, the one controller in the above substrate processing apparatus sends pulse signals to the other motors to start their rotation.

A substrate processing apparatus according to yet another embodiment of the present invention is characterized as follows: in the above substrate processing apparatus, the amount of pulse signals when the one motor has conducted a predetermined rotation means the amount of pulse signals when any of the operations is completed by the opening/closing member, elevator member or the transfer member that is driven by the one motor.

A substrate processing apparatus according to yet another embodiment of the present invention is characterized as follows: when a substrate is unloaded from the chamber in the above substrate processing apparatus, the one controller controls a pulse signal to a motor that drives the elevator member so that the elevator member finishes its ascent at the time the opening/closing member is completely open; or controls a pulse signal to a motor that drives the opening/closing member so that the opening/closing member is completely open at the time the elevator member completes its ascent.

A substrate processing method according to yet another embodiment of the present invention is carried out in a substrate processing apparatus to conduct predetermined treatment on a substrate, and is characterized as follows: when a substrate is transferred in the above substrate processing apparatus, one controller controls one or multiple motors that drive a transfer device for transferring a substrate, as well as one or multiple other motors that drive components other than the transfer device to be used in association with the substrate-transfer operation by the transfer device when a substrate is loaded to a predetermined position or unloaded from a predetermined position.

A substrate processing method according to yet another embodiment of the present invention is characterized by being executed in a substrate processing apparatus having a chamber to accommodate a substrate; an opening/closing member to open/close a substrate loading/unloading port door of the chamber; an elevator member to lift/lower the substrate in the chamber; and a transfer device to load/unload the substrate to/from the chamber. In such a substrate processing method, when the transfer device loads/unloads a substrate to/from the chamber, multiple motors to drive operations of the opening/closing member, the elevator member, and the transfer device are controlled by one controller.

In a substrate processing apparatus according to yet another embodiment of the present invention, one controller controls one or multiple motors that drive a transfer device for transferring a substrate as well as one or multiple other motors that drive other drive components needed in association with the substrate-transfer operation by the transfer device when a wafer is loaded to a predetermined position or unloaded from a predetermined position.

Accordingly, compared with an apparatus having multiple controllers including a controller to drive one or multiple motors for driving a transfer device as well as a different controller to drive one or multiple other motors for driving other transfer components, the number of communications among multiple controllers decreases to reduce communication time, thereby improving throughput of substrate transfer, and subsequently improving throughput for substrate processing in the substrate processing apparatus according to the embodiments of the present invention.

Moreover, one controller conducts multiple operations simultaneously based on the amount of drive signals the one controller sends to each motor; for example, the one controller starts other driving components while driving the transfer device, or, conversely, the one controller starts the transfer device while driving other driving components. Thus, throughput is even more improved. During that time, since sensors and the like to detect positions of the transfer device and other drive components are not needed, and the number of controllers decreases, the cost of running the substrate processing apparatus is reduced.

Furthermore, when there are multiple operations that can be conducted simultaneously, if it is sufficient for one operation that transfers or moves a substrate to be completed by the time the other simultaneously conducted operation is finished, one controller can adjust the speed in the one operation by simply changing the supply mode of the pulse signal. Such a control does not decrease throughput, rather, to transfer a substrate slowly contributes to enhancing the accuracy and security of the substrate transfer by preventing the positional shifting or fallout of a substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate processing apparatus for processing a substrate, comprising:
a transfer device comprising a drive motor and configured to transfer a substrate;
a peripheral device comprising a drive motor and configured to load and unload the substrate in a substrate-transfer operation of the transfer device; and
a control device comprising circuitry configured to conduct drive control of the drive motor of the transfer device and drive control of the drive motor of the peripheral device,
wherein the drive motor of the transfer device is a servo motor configured to be driven by pulse signals, the drive motor of the peripheral device is a servo motor configured to be driven by pulse signals, the circuitry of the control device is configured to control the drive motor of the transfer device and the drive motor of the peripheral device such that the control device conducts closed-loop control by the pulse signals, and the circuitry of the control device is configured to use a trigger which is a signal amount of the pulse signals assigned to a set amount of rotations by one of the drive motor of the transfer device and the drive motor of the peripheral device such that the control device transmits a pulse signal which starts rotation of the other one of the drive motor of the transfer device and the drive motor of the peripheral device.

2. The substrate processing apparatus according to claim 1, wherein the signal amount is a signal amount of the pulse signals when operation by the other one of the drive motor of the transfer device and the drive motor of the peripheral device is completed.

3. A substrate processing apparatus, comprising:
a chamber configured to accommodate a substrate and having a substrate loading-unloading port;
an open-close device comprising a drive motor and configured to open and close the substrate loading-unloading port;
an elevator device comprising a drive motor and configured to lift and lower the substrate in the chamber;
a transfer device comprising a drive motor and configured to load and unload the substrate to and from the chamber; and
a control device comprising circuitry configured to conduct drive control of the drive motor of the transfer device, drive control of the drive motor of the open-close device and drive control of the drive motor of the elevator device,
wherein the drive motor of the transfer device is a servo motor configured to be driven by pulse signals, the drive motor of the open-close device is a servo motor configured to be driven by pulse signals, the drive motor of the elevator device is a servo motor configured to be driven by pulse signals, the circuitry of the control device is configured to control the drive motor of the transfer device, the drive motor of the open-close device and the drive motor of the elevator device such that the control device conducts closed-loop control by the pulse signals, and the circuitry of the control device is configured to use a trigger which is a signal amount of the pulse signals assigned to a set amount of rotations by one of the drive motor of the transfer device, the drive motor of the open-close device and the drive motor of the elevator device such that the control device transmits a pulse signal which starts rotation of another one of the drive motor of the transfer device, the drive motor of the open-close device and the drive motor of the elevator device.

4. The substrate processing apparatus according to claim 3, wherein the signal amount is a signal amount of the pulse signals when operation by the other one of the drive motor of the transfer device, the drive motor of the open-close device and the drive motor of the elevator device is completed.

5. The substrate processing apparatus according to claim 4, wherein the circuitry of the control device is configured to control the pulse signals to the drive motor of the elevator device such that when the substrate is unloaded from the chamber, the elevator device completes lifting at a time when the open-close device completes opening.

6. The substrate processing apparatus according to claim 4, wherein the circuitry of the control device is configured to control the pulse signals to the drive motor of the open-close device such that the open-close device completes opening at a time when the elevator device completes lifting.

7. The substrate processing apparatus according to claim 3, wherein the circuitry of the control device is configured to control the pulse signals to the drive motor of the elevator device such that when the substrate is unloaded from the chamber, the elevator device completes lifting at a time when the open-close device completes opening or is configured to control the pulse signals to the drive motor of the open-close device such that the open-close device completes opening at a time when the elevator device completes lifting.

8. The substrate processing apparatus according to claim 3, wherein the circuitry of the control device is configured to control the pulse signals to the drive motor of the elevator device such that when the substrate is unloaded from the chamber, the elevator device completes lifting at a time when the open-close device completes opening.

9. The substrate processing apparatus according to claim 3, wherein the circuitry of the control device is configured to control the pulse signals to the drive motor of the open-close device such that the open-close device completes opening at a time when the elevator device completes lifting.

10. A method for processing a substrate, comprising:
transmitting a signal from a control device of a substrate processing apparatus to a drive motor of a transfer device in the substrate processing apparatus such that the transfer device transfers a substrate inside the substrate processing apparatus; and
transmitting a signal from the control device to a drive motor of a peripheral device in the substrate processing apparatus such that the peripheral device loads or unloads the substrate to or from the transfer device in a substrate-transfer operation of the transfer device,
wherein the drive motor of the transfer device is a servo motor configured to be driven by pulse signals, the drive motor of the peripheral device is a servo motor configured to be driven by pulse signals, the control device comprises circuitry configured to control the drive motor of the transfer device and the drive motor of the peripheral device such that the control device conducts closed-loop control by the pulse signals, and the circuitry of the control device is configured to use a trigger which is a signal amount of the pulse signals assigned to a set amount of rotations by one of the drive motor of the transfer device and the drive motor of the peripheral device such that the control device transmits a pulse signal which starts rotation of the other one of the drive motor of the transfer device and the drive motor of the peripheral device.

11. The method for processing a substrate according to claim 10, wherein the signal amount is a signal amount of the pulse signals when operation by the other one of the drive motor of the transfer device and the drive motor of the peripheral device is completed.

12. A method for processing a substrate, comprising:
transmitting a signal from a control device of a substrate processing apparatus to a drive motor of an open-close device in the substrate processing apparatus such that the open-close device opens or closes a substrate loading-unloading port of a chamber configured to accommodate a substrate in the substrate processing apparatus;
transmitting a signal from the control device to a drive motor of an elevator device in the substrate processing apparatus such that the elevator device lifts or lowers the substrate in the chamber; and
transmitting a signal from the control device to a drive motor of a transfer device in the substrate processing apparatus such that the transfer device transfers the substrate in the substrate processing apparatus,
wherein the drive motor of the transfer device is a servo motor configured to be driven by pulse signals, the drive motor of the open-close device is a servo motor configured to be driven by pulse signals, the drive motor of the elevator device is a servo motor configured to be driven by pulse signals, the control device comprises circuitry configured to control the drive motor of the transfer device, the drive motor of the open-close device and the drive motor of the elevator device such that the control device conducts closed-loop control by the pulse signals, and the circuitry of the control device is configured to use a trigger which is a signal amount of the pulse signals assigned to a set amount of rotations by one of the drive motor of the transfer device, the drive motor of the open-close device and the drive motor of the elevator device such that the control device transmits a pulse signal which starts rotation of another one of the drive motor of the transfer device, the drive motor of the open-close device and the drive motor of the elevator device.

13. The method for processing a substrate according to claim 12, wherein the signal amount is a signal amount of the pulse signals when operation by the other one of the drive motor of the transfer device, the drive motor of the open-close device and the drive motor of the elevator device is completed.

14. The method for processing a substrate according to claim 13, wherein the circuitry of the control device is configured to control the pulse signals to the drive motor of the elevator device such that when the substrate is unloaded from the chamber, the elevator device completes lifting at a time when the open-close device completes opening.

15. The method for processing a substrate according to claim 13, wherein the circuitry of the control device is configured to control the pulse signals to the drive motor of the open-close device such that the open-close device completes opening at a time when the elevator device completes lifting.

16. The method for processing a substrate according to claim 12, wherein the circuitry of the control device is configured to control the pulse signals to the drive motor of the elevator device such that when the substrate is unloaded from the chamber, the elevator device completes lifting at a time when the open-close device completes opening or is configured to control the pulse signals to the drive motor of the open-close device such that the open-close device completes opening at a time when the elevator device completes lifting.

17. The method for processing a substrate according to claim 12, wherein the circuitry of the control device is configured to control the pulse signals to the drive motor of the elevator device such that when the substrate is unloaded from the chamber, the elevator device completes lifting at a time when the open-close device completes opening.

18. The method for processing a substrate according to claim 12, wherein the circuitry of the control device is configured to control the pulse signals to the drive motor of the open-close device such that the open-close device completes opening at a time when the elevator device completes lifting.

* * * * *